(12) United States Patent
Kinoshita (10) Patent No.: US 12,241,914 B2
(45) Date of Patent: Mar. 4, 2025

(54) CURRENT SENSING DEVICE

(71) Applicant: KOA CORPORATION, Nagano (JP)

(72) Inventor: Miyahito Kinoshita, Nagano (JP)

(73) Assignee: KOA Corporation, Nagano (JP)

( * ) Notice: Subject to any disclaimer, the term of this patent is extended or adjusted under 35 U.S.C. 154(b) by 320 days.

(21) Appl. No.: 17/910,253

(22) PCT Filed: Dec. 28, 2020

(86) PCT No.: PCT/JP2020/049063
§ 371 (c)(1),
(2) Date: Sep. 8, 2022

(87) PCT Pub. No.: WO2021/181835
PCT Pub. Date: Sep. 16, 2021

(65) Prior Publication Data
US 2023/0100174 A1    Mar. 30, 2023

(30) Foreign Application Priority Data
Mar. 10, 2020    (JP) .................. 2020-041006

(51) Int. Cl.
*G01R 1/20* (2006.01)
*G01R 19/00* (2006.01)
*H05K 1/11* (2006.01)
*H05K 1/16* (2006.01)
*H05K 3/46* (2006.01)

(52) U.S. Cl.
CPC ......... *G01R 1/203* (2013.01); *G01R 19/0092* (2013.01); *H05K 1/115* (2013.01); *H05K 1/167* (2013.01); *H05K 3/4632* (2013.01)

(58) Field of Classification Search
CPC .... G01R 1/203; G01R 19/0092; H05K 1/115; H05K 1/167; H05K 3/4632
See application file for complete search history.

(56) References Cited

U.S. PATENT DOCUMENTS 8,142,237 B2 *  3/2012  Condamin ............. G01R 1/203
439/957
8,193,898 B2 *  6/2012  Tonouchi ................. H01C 7/18
338/254

(Continued)

FOREIGN PATENT DOCUMENTS

JP          5298336 B2 *  9/2013
JP        2014-239142 A   12/2014

(Continued)

OTHER PUBLICATIONS

JP-5298336, machine translation (Year: 2013).*

(Continued)

*Primary Examiner* — Kyung S Lee
(74) *Attorney, Agent, or Firm* — Crowell & Moring LLP (57) ABSTRACT

A current sensing device including: an insulating resin substrate; a current sensing element arranged in the resin substrate; a current wire provided via an insulating layer with respect to the current sensing element to flow a current through the current sensing element; a plurality of current vias connecting the current sensing element and the current wire through the insulating layer; and a voltage sensing via connected to the current sensing element to measure a voltage drop.

7 Claims, 13 Drawing Sheets

(56) References Cited

U.S. PATENT DOCUMENTS

| | | | | |
|---|---|---|---|---|
| 9,839,132 B2* | 12/2017 | Fujidai | .................. | H05K 1/185 |
| 2008/0030208 A1* | 2/2008 | Aratani | ............... | H01M 10/425 |
| | | | | 324/713 |
| 2014/0110160 A1* | 4/2014 | Banba | .................... | H05K 1/115 |
| | | | | 174/257 |

FOREIGN PATENT DOCUMENTS

| | | |
|---|---|---|
| JP | 2015-002333 A | 1/2015 |
| JP | 2015-017832 A | 1/2015 |
| WO | WO 2013-002308 A1 | 1/2013 |

OTHER PUBLICATIONS

International Search Report, English translation, from Application No. PCT/JP2020/049063, dated Mar. 9, 2021, 3 pages.
Written Opinion, including English translation, from Application No. PCT/JP2020/049063, dated Mar. 9, 2021, 6 pages.

* cited by examiner

CURRENT SENSING DEVICE

CROSS-REFERENCE TO RELATED APPLICATIONS

This application is a 371 application of PCT/JP2020/049063 having an international filing date of Dec. 28, 2020, which claims priority to JP2020-041006 filed Mar. 10, 2020, the entire content of each of which is incorporated herein by reference.

TECHNICAL FIELD

The present invention relates to a current sensing device.

BACKGROUND ART

Conventionally, current sensing devices have been proposed that comprise a resistive element-incorporating substrate in which a resistive element for current sensing is incorporated in a laminate having a plurality of insulating layers (ceramic layers) laminated therein (see Patent Literature 1 and Patent Literature 2, for example).

In Patent Literature 1, metal vias are embedded on the inside of vias extending through a plurality of laminated insulating layers and are connected to electrodes of a resistor, in order to increase the heat-dissipating effect of the resistor incorporated in a laminate substrate.

In Patent Literature 2, in a structure similar to that of Patent Literature 1, the number of a plurality of first (second) sensing via conductors arrayed in a predetermined direction is adjusted so that, without adjusting the via diameter of each of the first (second) sensing via conductors, the width W of a resistive film of a resistor is increased in a simulated manner by connecting the plurality of first (second) sensing via conductors in parallel. Thus, the disclosed technique adjusts the width of the resistive film in a simulated manner. In this way, it is possible to easily design the resistance value of a current sensing resistor provided in a laminate without changing the diameter of each of the first and second sensing via conductors connected to the resistive film of the current sensing resistor.

CITATION LIST

Patent Literature

Patent Literature 1: JP 2014-239142 A
Patent Literature 2: JP 2015-002333 A

SUMMARY OF INVENTION

Technical Problem

In current sensing devices, there is a need to suppress the influence of temperature coefficient of resistance (TCR). It is an objective of the present invention to suppress the influence of TCR in an incorporating substrate.

Solution to Problem

One aspect of the present invention provides a current sensing device including: an insulating resin substrate; a current sensing element arranged in the resin substrate; a current wire provided via an insulating layer with respect to the current sensing element to flow a current through the current sensing element; a plurality of current vias connecting the current sensing element and the current wire through the insulating layer; and a voltage sensing via connected to the current sensing element to measure a voltage drop.

Because the voltage via is connected to an electrode terminal of a shunt resistor directly without interposing a current wire or the like, the TCR of the current sensing device can be reduced.

Preferably, the current vias may be provided on a first surface side of the resin substrate, and the voltage via may be provided on a second surface side of the resin substrate.

In this configuration, the current vias and the voltage via are separated from each other so that the influence of TCR can be reduced.

When the current vias and the voltage via are provided on one of the first surface side and the second surface side of the resin substrate, a wire connecting the current vias and the voltage via may preferably be severed.

In this configuration, the current vias and the voltage via are electrically separated from each other so that the influence of TCR can be reduced.

Preferably, the current sensing element may be a shunt resistor, and the shunt resistor may have a thickness of more than or equal to 0.5 mm.

By increasing the thickness of the shunt resistor, the current vias and the voltage via can be separated away from each other in the thickness direction.

Preferably, the first surface and the second surface of the resin substrate are respectively flush with a first surface and a second surface of the current sensing element. Preferably, the resin substrate and the current sensing element may be coated with a resin layer.

In this configuration, lamination may be performed in the direction of either the first surface side or second surface side to realize a vertical integrated structure easily.

The present specification incorporates the disclosure of JP Patent Application No. 2020-041006 that forms the basis of the priority claim of the present application.

Advantageous Effects of Invention

According to the present invention, it is possible to suppress the influence of TCR in an incorporating substrate.

BRIEF DESCRIPTION OF DRAWINGS

FIGS. 2AA, 2AB and 2AC illustrate an example of a manufacturing method for the current sensing device illustrated in FIG. 1, with reference to the cross-sectional structure thereof.

FIGS. 2BD, 2BE and 2BF illustrate an example of a manufacturing method for the current sensing device illustrated in FIG. 1, with reference to the cross-sectional structure thereof.

DESCRIPTION OF EMBODIMENTS

In the following, the current sensing device according to embodiments of the present invention will be described with reference to the drawings.

First Embodiment

Configuration Example of Current Sensing Device

Figure 1:
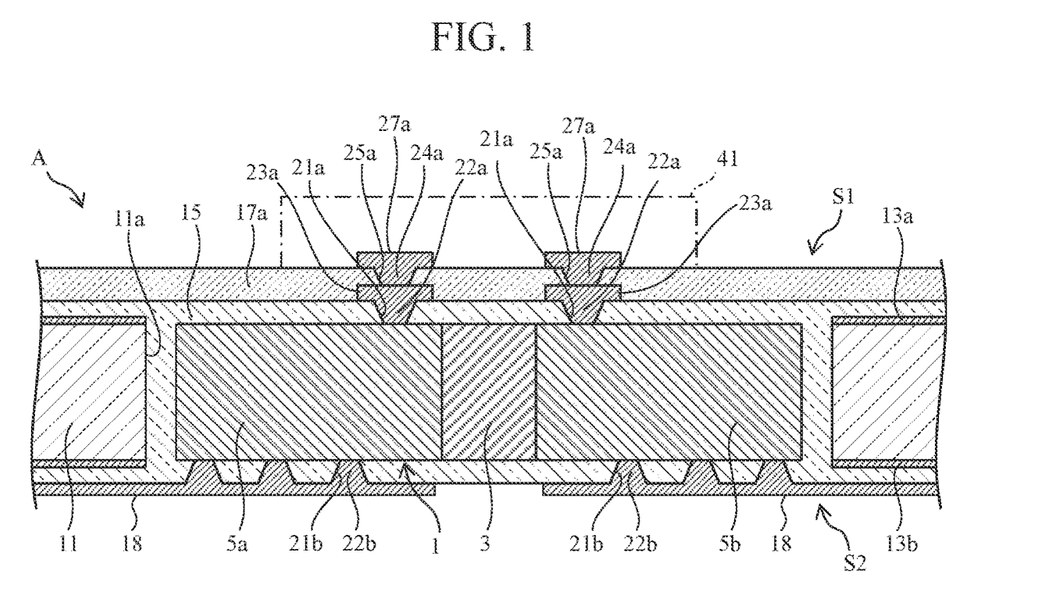
FIG. 1 is a cross sectional view illustrating one configuration example of a current sensing device according to a first embodiment of the present invention.

FIG. 1 is a cross sectional view illustrating one configuration example of a current sensing device according to a first embodiment of the present invention.

As illustrated in FIG. 1, the current sensing device A according to the present embodiment includes an insulating resin substrate 11 formed from glass epoxy resin or the like, and a current sensing element, which may be a shunt resistor 1, for example, incorporated in the insulating resin substrate 11. The shunt resistor 1 includes a resistive body 3 and a pair of electrode terminals 5a, 5b provided on both sides thereof. The first electrode 5a and the second electrode 5b are made of electrically conductive metal material, such as Cu. As the material for the resistive body 3, metal materials such as Cu—Ni-based, Cu—Mn-based, and Ni—Cr-based metal materials may be used. The shunt resistor 1 may be of elementary metal such as a Cu—Ni-based metal material, or may have a coated structure comprising a resistive metal material. These are collectively referred to as a current sensing element. On a first surface S1 side and a second surface S2 side of the insulating resin substrate 11, Cu foil layers 13a, 13b are formed, for example. The resin substrate 11 has a through hole 11a formed therein for accommodating the shunt resistor 1.

The resin substrate 11 has the first surface S1 and the second surface S2, and the shunt resistor 1 correspondingly has a first surface S1 and a second surface S2. The resin substrate 11 and the shunt resistor 1 are formed so that their respective first surfaces S1 and the second surfaces S2 are respectively approximately flush with each other.

The insulating resin substrate 11 and the shunt resistor 1 are integrated by means of a resin layer 15 generated by applying and curing a low temperature-curing resin, such as epoxy resin that cures at a low temperature of 200° C. or lower, to areas between the side surfaces of the resin substrate 11 and the shunt resistor 1 and to the first surfaces S1 and the second surfaces S2. In the resin layer 15 formed on the first surface S1 side of the electrode 5a and the electrode 5b, a pair of through holes 21a, 21a (contact holes: CH) are formed at positions on the electrode 5a and the electrode 5b closer to the resistive body 3, the through holes 21a, 21a exposing the first surface S1 of the electrodes 5a, 5b.

In the through holes 21a, 21a, electrically conductive vias (which may also be referred to as metal vias or conducting vias) 22a, 22a are respectively embedded. The electrically conductive vias 22a, 22a can be used as vias for voltage sensing. On the first surface side, first voltage wires 23a can be formed together with the vias 22a, 22a.

Also in the resin layer 15 formed on the second surface S2 side of the electrode 5a and the electrode 5b, a pair of through holes 21b, 21b (contact holes: CH) are formed, exposing the second surface of the electrodes 5a, 5b.

In the through holes 21b, 21b, electrically conductive vias (which may also be referred to as metal vias or conducting vias) 22b, 22b are embedded. The electrically conductive vias 22b, 22b can be used as current sensing vias. On the second surface side, first current wires 18 can be formed together with the vias.

Further, by applying and curing resin on the first surface S1 of the resin layer 15 on the first surface S1 side, a resin layer 17a can be formed. The resin layer 17a also has through holes 25a, 25a formed therein to expose the first voltage wires 23a, 23a. On the first surface side, second voltage sensing wires 27a, 27a are formed together with the electrically conductive vias 24a, 24a. Thus, a voltage electrically connected to the first surface S1 of the resin layer 17a by means of the electrodes 5a, 5b and the voltage wires can be sensed from the first surface S1 side.

Further, by mounting, on the first surface S1 side, an electronic component (such as an IC) 41 for sensing voltage and connecting the electronic component to the second voltage sensing wires 27a, 27a, a voltage signal can be sensed by computation or the like.

In this way, it is possible to form a new resin layer and successively laminate, mount, and form wires provided in the new resin layer and an electronic component, such as a semiconductor integrated circuit, as needed.

In the structure illustrated in FIG. 1, the voltage sensing wires are formed on the first surface S1 side, and the current wires are formed on the second surface S2 side. Thus, in the shunt resistor 1, the second surface S2 side provides a dominant current path, and the first surface S1 side of the shunt resistor 1 is less likely to have a potential distribution due to the influence of current. Accordingly, by connecting the voltage sensing wires at a position less susceptible to the influence of the current path, i.e., on the first surface S1 in FIG. 1, it is possible to perform voltage sensing in a manner less susceptible to the characteristics of copper as wire material, and with a decreased influence of TCR.

As will be described later, the influence of TCR may also be suppressed by providing the current path and the voltage vias 22a, 22b on either the first surface S1 or the second surface S2 in an appropriate arrangement.

Example of Manufacturing Process

Figure 2:
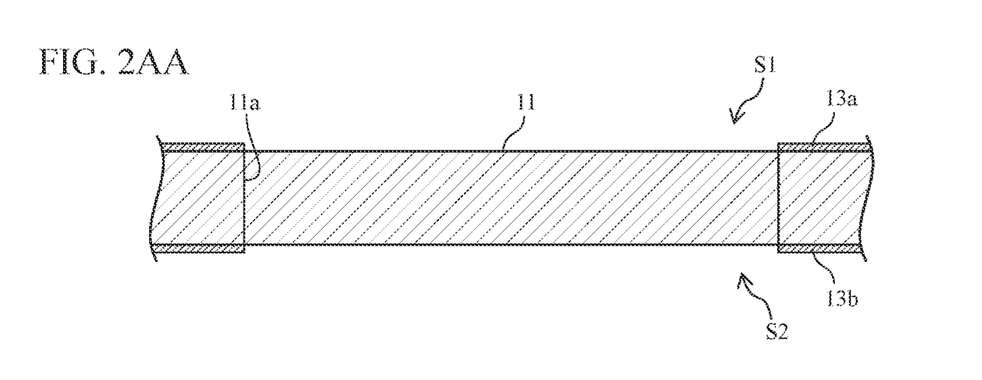

FIGS. 2AA-2AC and FIGS. 2BD-2BF illustrate an example of a manufacturing method for the current sensing device illustrated in FIG. 1, with reference to the cross-sectional structure thereof.

As illustrated in FIG. 2AA, first, the insulating resin substrate 11 is prepared. On the first surface S1 and the second surface S2 of the insulating resin substrate 11, the Cu foil layers 13a, 13b for forming a pattern are formed, for example.

As illustrated in FIG. 2AB, the resin substrate 11 having the Cu foil layers 13a, 13b formed on both surfaces thereof is prepared. In the resin substrate 11, an accommodating portion 11a for accommodating the shunt resistor 1 is formed in a predetermined region through the insulating resin substrate 11. The resin substrate 11 is a substrate that serves as a base for forming a multilayer structure. The resin substrate 11 has a thickness similar to that of the shunt resistor 1.

The shunt resistor 1 is accommodated/provisionally fixed flush in the accommodating portion 11a. FIG. 2AB also shows a perspective view corresponding to the cross-sectional view.

As illustrated in FIG. 2AC, the shunt resistor 1 can be accommodated/solidly fixed in the through hole 11a of the insulating resin substrate 11 by means of the resin layer 15 formed by applying and curing epoxy resin and the like at low temperature. The resin layer 15 is also formed on the first surface S1 and the second surface S2 of the insulating resin substrate 11.

As illustrated in FIG. 2BD, in the resin layer 15 formed on the first surface S1 side, the pair of through holes 21a, 21a (contact holes: CH) exposing the surfaces of the electrodes 5a, 5b are formed at positions on the electrode 5a and the electrode 5b closer to the resistive body 3, using a known patterning technique employing a laser and the like.

Similarly, in the resin layer 15 on the second surface S2 side, the through holes 21b, 21b, for example, exposing the second surface S2 of the electrodes 5a, 5b are formed.

As illustrated in FIG. 213E, metal layers 22, 23 are formed on the first surface S1 and the second surface S2 by plating, for example. The metal layers 22, 23 are also filled inside the through holes.

As illustrated in FIG. 2CF, the wires 23a, 23a are formed in a predetermined region, including the inside of the vias 21a, 21a, of the first surface S1, through a patterning step, for example.

Further, on the second surface S2 too, the vias 22b, 22b are formed in the second surface S2, and the wires 18, 18 are formed in a predetermined region including the vias 22b, 22b, through a patterning step, for example.

Subsequently, a step of coating a resin layer (laminating), laser processing and the like may be repeated as needed, to form a three-dimensionally wired laminate structure.

Thus, by successively forming a resin layer (inter-layer insulating film), a circuit pattern and the like on at least one of the first surface S1 and the second surface S2 of the insulating resin substrate 11, it is possible to form a multilayer integrated structure including a current sensing device.

Figure 3:
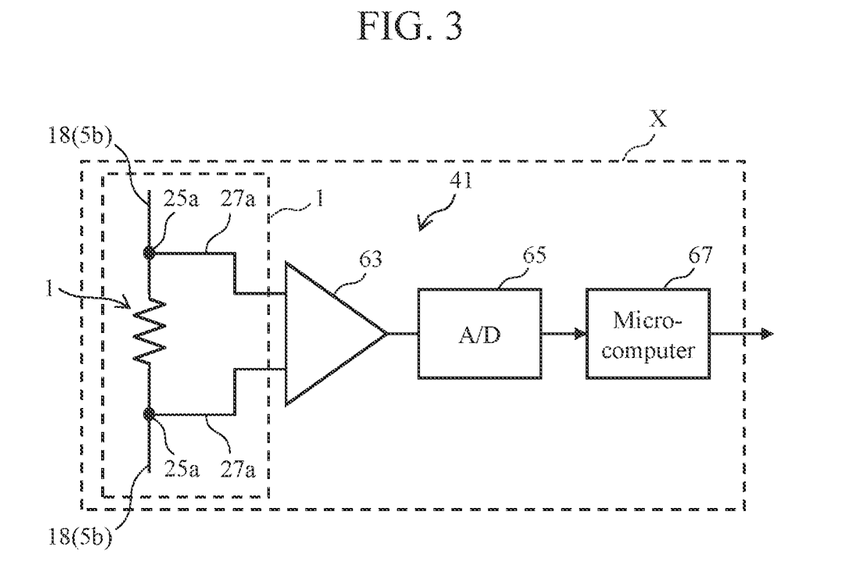
FIG. 3 is a functional block diagram illustrating a circuit configuration example of a current sensing device including a current sensing circuit, illustrating an example in which a shunt resistor is mounted.

FIG. 3 is a functional block diagram illustrating a circuit configuration example of a current sensing device X including a current sensing circuit 41, illustrating an example of the shunt resistor 1 in mounted state. The voltage wires 27a, 27a are respectively connected to the electrodes 5a, 5b of the shunt resistor for voltage measurement. The voltage wires 27a, 27a are connected to the IC 41 via the voltage vias 24a, 24a. The current wires 18 are arranged outside a voltage measurement position of the electrodes 5a, 5b of the shunt resistor 1.

The integrated circuit 41 may be mounted on, incorporated in, or separate from the current sensing device A comprising the laminate, and is wired and connected. As a whole, the current sensing module X is formed. The IC has an A/D conversion circuit 63, an amplification circuit 65, a microcomputer 67 and the like incorporated therein, and outputs signals corresponding to a voltage signal to various devices. With this structure, it is possible to configure the current sensing module X capable of measuring a current flowing between the wires 18, 18 by means of the shunt resistor 1.

TCR Computation Results

Figure 4A:
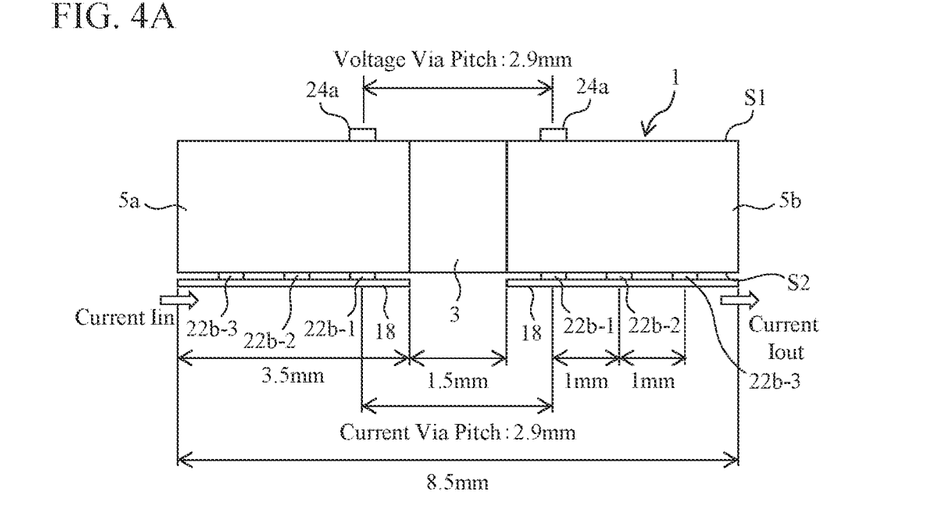
FIGS. 4A and 4B show a schematic diagram (side view) of a current sensing device A according to an embodiment, illustrating a base model used for TCR simulation.
Figure 4B:
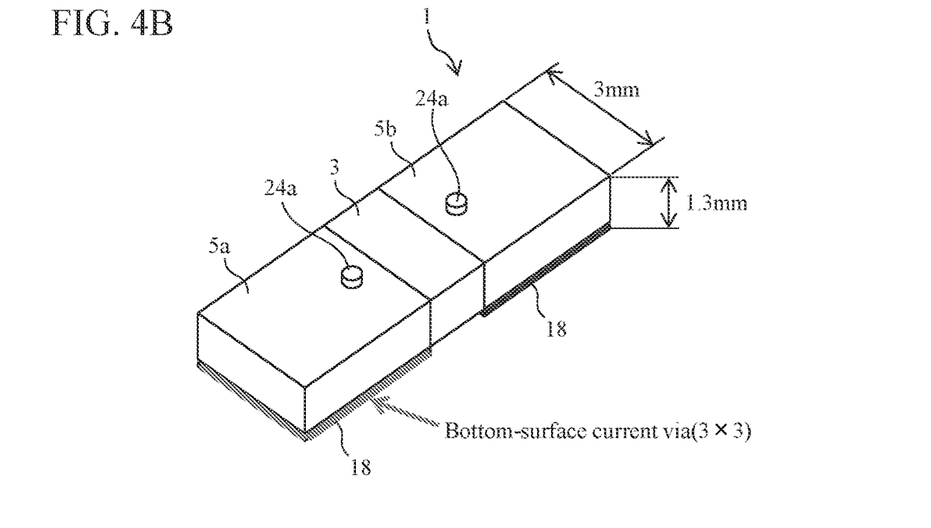

FIGS. 4A and 4B show schematic diagrams of the current sensing device A according to the present embodiment, and illustrates a base model used for TCR simulation.

TABLE 1

| Portion | Material | Resistivity [µΩ · cm] | TCR [ppm/K] | Remarks |
|---|---|---|---|---|
| Resistive body | CuMn alloy | 43 | 0 | TCR assumed to be "0 ppm/K" |
| Electrode | Cu | 1.7 | 4,000 | |
| Pattern | Cu | 1.7 | 4,000 | Pattern thickness 70 µm |
| Via | Cu | 1.7 | 4,000 | Via diameter Φ 0.4 mm, height 0.1 mm |

Table 1 illustrates physical property values used for simulation.

Of the resistive body 3 of the shunt resistor 1, the material was a CuMn alloy, the resistivity was 43 µΩ cm, and the TCR was 0 ppm/K. The thickness was 1.3 mm.

Of the electrodes 5a, 5b of the shunt resistor 11, the material was Cu, the resistivity was 1.7 µΩ cm, and the TCR was 4,000 ppm/K. The thickness was 1.3 mm.

Of the wiring pattern, the material was Cu, the resistivity was 1.7 µΩ cm, and the TCR was 4,000 ppm/K, The thickness of the pattern was 70 µm.

Of the electrode vias, the material was Cu, the resistivity was 1.7 µΩ cm, and the TCR was 4,000 pm/K. The via diameter (Φ) was 0.4 mm, and the height was 0.1 mm.

FIG. 4A is a cross sectional view illustrating a schematic configuration example of a current, sensing device as a model for evaluating, by simulation, the TCR characteristics of the current sensing device described above with reference to FIG. 1 to FIG. 3. FIG. 4B is a perspective view.

As illustrated in FIG. 4A and FIG. 4B, the length of the Cu electrodes 5a, 5b of the shunt resistor 1 in the direction of current flow is 3.5 mm, and the length of the resistive body 3 is 1.5 mm. The pitch of the voltage vias 24a, 24a provided on the first surface S1 of the electrodes 5a, 5b is 29 mm. The pitch of the closest current vias 22b-1, 22b-1 provided on the second surface S2 is also 29 mm. The current vias 22b-1 to 3 on the second surface have a 3×3 arrangement.

The entire length of the shunt, resistor 1 is 8.5 mm. The width of the shunt resistor is 3 mm, and its thickness is 1.3 mm. Specifically, the thickness of the shunt resistor is more than or equal to 0.5 mm. The maximum thickness value may be on the order of 3 mm, in view of processability, electrically conductivity and the like. In consideration of the mounting of the shunt resistor 1 in the resin substrate 11, the thickness may preferably be between 0.5 to 1.5 mm. More specifically, the thickness may be said to be the thickness of the electrodes 5a, 5b. As illustrated in FIG. 4A, a current Iin flows via the current wires 18, the current vias 22b-1 to 22b-3, the electrode 5a, the resistive body 3, the current. 5b, the heat-dissipating vias 22b (vias connected to the current 5b), the current wires 18, and out as a current Iout. Because the main current path is on the second surface S2 side of the shunt resistor 1, a potential distribution is less likely to occur on the first surface S1 side of the shunt resistor 1 compared to the second surface S2 side. Accordingly, by connecting the voltage vias 24a, 24a to the surface of the first surface S1, it becomes possible to perform stable current sensing with a decreased influence of a potential distribution. In order to obtain such effect, preferably the shunt resistor (or the electrodes to which the voltage vias are connected) has a predetermined thickness, such as more than or equal to 0.5 mm as described above.

Figure 5:
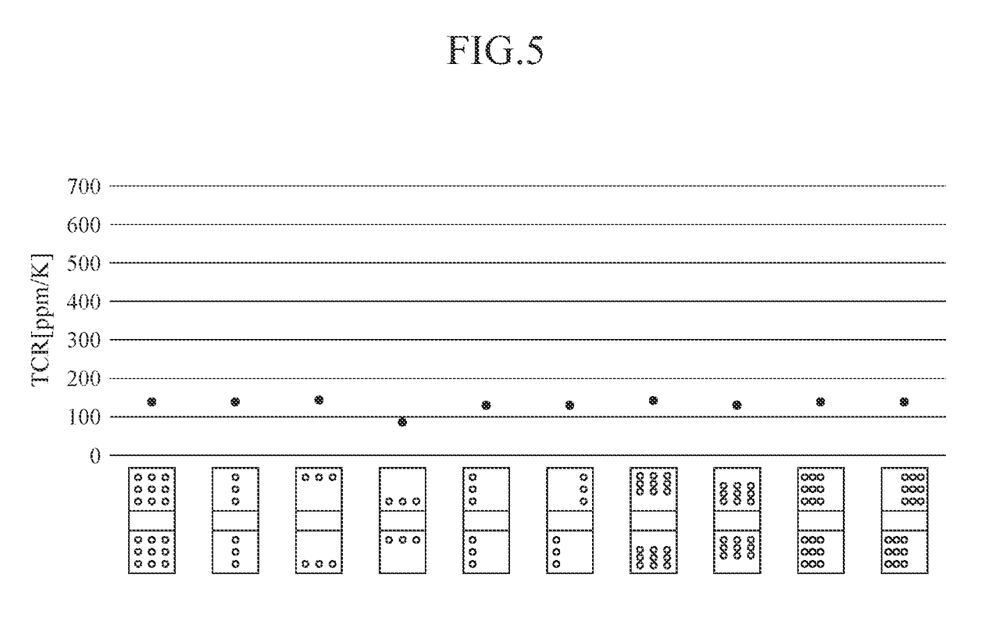
FIG. 5 illustrates TCR values in the structure illustrated in FIG. 4 and in other via-arrangement variations.

FIG. 5 illustrates TCR values observed when the arrangement of the current vias was changed, based on the structure illustrated in FIGS. 4A and 4B. At the bottom of FIG. 5, the via arrangements in the shunt resistor are illustrated in plan view, with the TCR computation results shown directly above.

It will be seen that, when the voltage vias and the current vias illustrated in FIGS. 4A and 4B are arranged on the first surface and the second surface of the insulating resin substrate 11, the TCR for each of the examples with the various arrangements of the current vias is less than or equal to 200 ppm/K, as illustrated in FIG. 5, exhibiting low values on the order of roughly 160 to 170 ppm/K. That is, the dependency with respect to the TCR on via arrangement and the number of vias (via density) is also small.

Thus, by arranging the voltage vias and the current vias at positions less susceptible to the influence of the current path, such as on the first surface and the second surface of the insulating resin substrate 11 separately, it is possible to perform voltage sensing that is less susceptible to the characteristics of the copper of the electrodes, and with a decreased influence of TCR. It also becomes possible to reduce the via arrangement dependency.

Figure 6A:
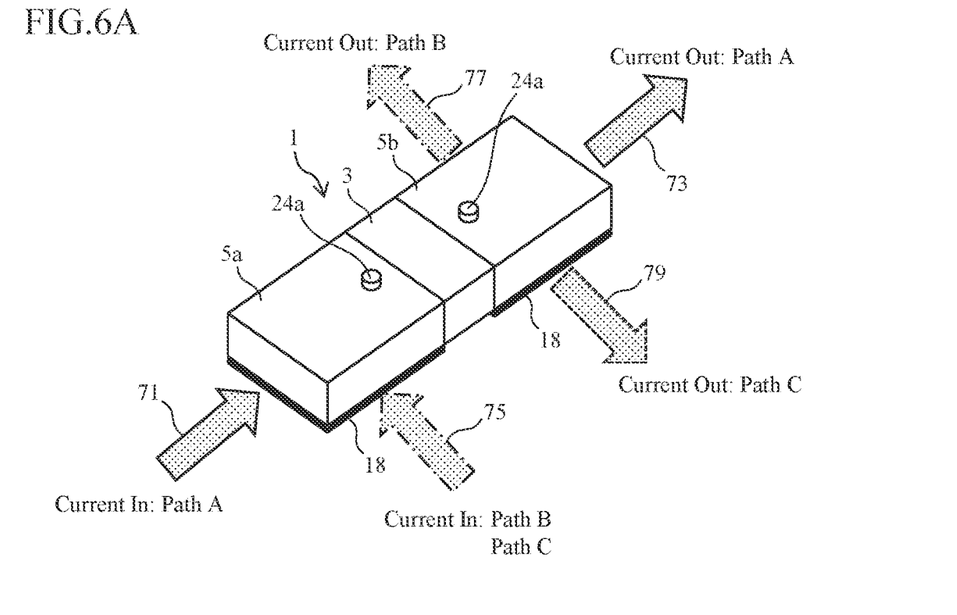
FIGS. 6A and 6B illustrate the relationship between the current path and via position of the current sensing device illustrated in FIG. 4, and depicts a plurality of current paths.
Figure 6B:
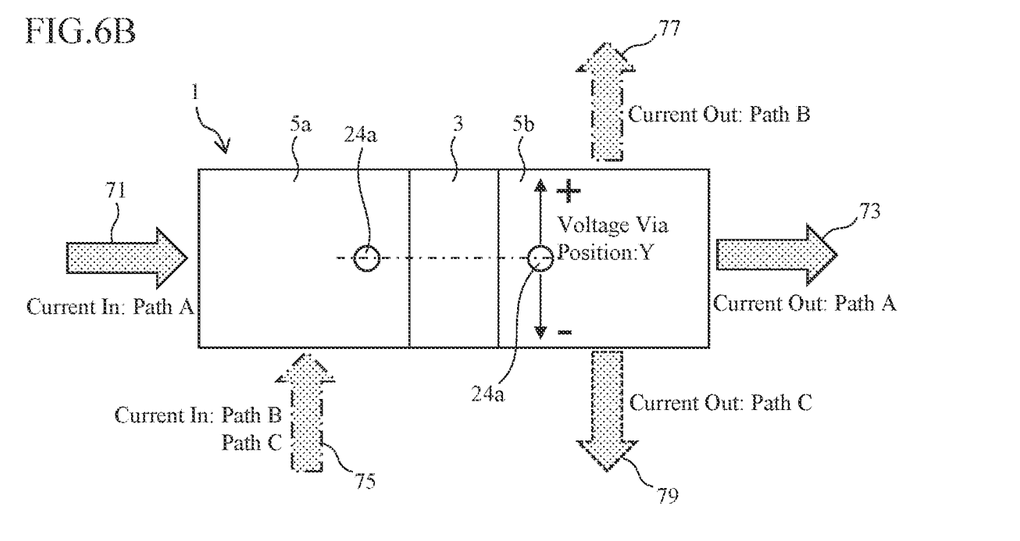
Figure 7:
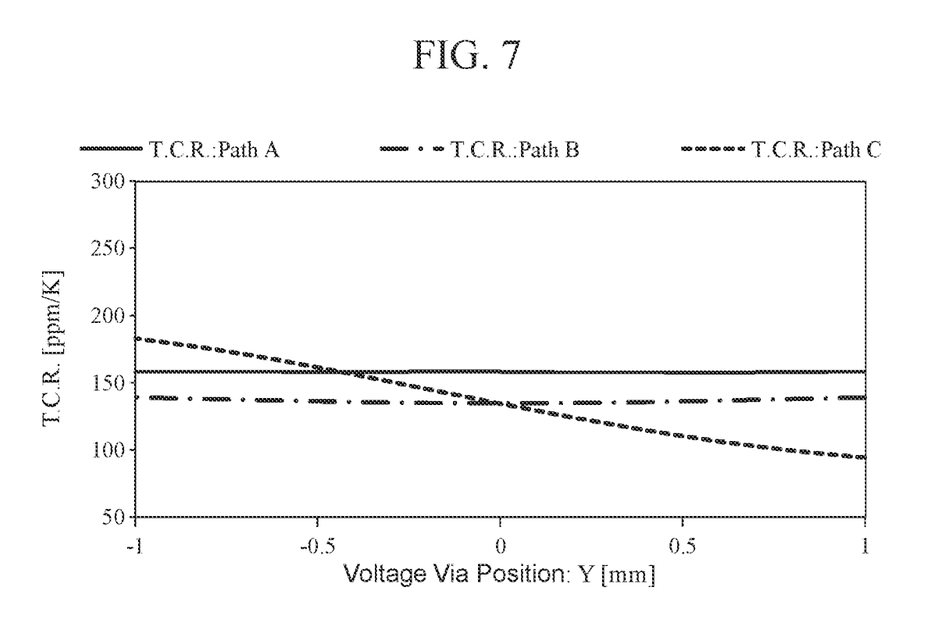
FIG. 7 illustrates the voltage via dependency of TCR in first to third current paths.

FIGS. 6A and 6B illustrate the relationship between the current path and the voltage via position of the current sensing device illustrated in FIGS. 4A and 4B. FIG. 7 illustrates the dependency of TCR on different current, paths and voltage via positions (see FIG. 6B).

As illustrated in FIGS. 6A and 6B, the TCR was computed for each of a first current path A (71-73) in which current, is flown linearly between the ends of the terminals of the current sensing device; a second current path B (75-77) in which current is flown in S-shape between side surfaces (different side surfaces) of the terminals of the current sensing device; and a third current path C (75-79) in which current, is flown in U-shape between side surfaces (same side surfaces) of the terminals of the current sensing device.

FIG. 7 illustrates the voltage via-position dependency of TCR in the first to third current paths A to C.

As illustrated in FIG. 7, it is seen that the TCR is influenced by a change in current path. In the current paths A, B, it is seen that there is not much change in TCR due to voltage via position, and that the voltage via-position dependency of TCR is small, in the current path C, TCR is influenced by the voltage via position. However, the TCR is generally below 200 ppm/K.

Second Embodiment

Figure 8A:
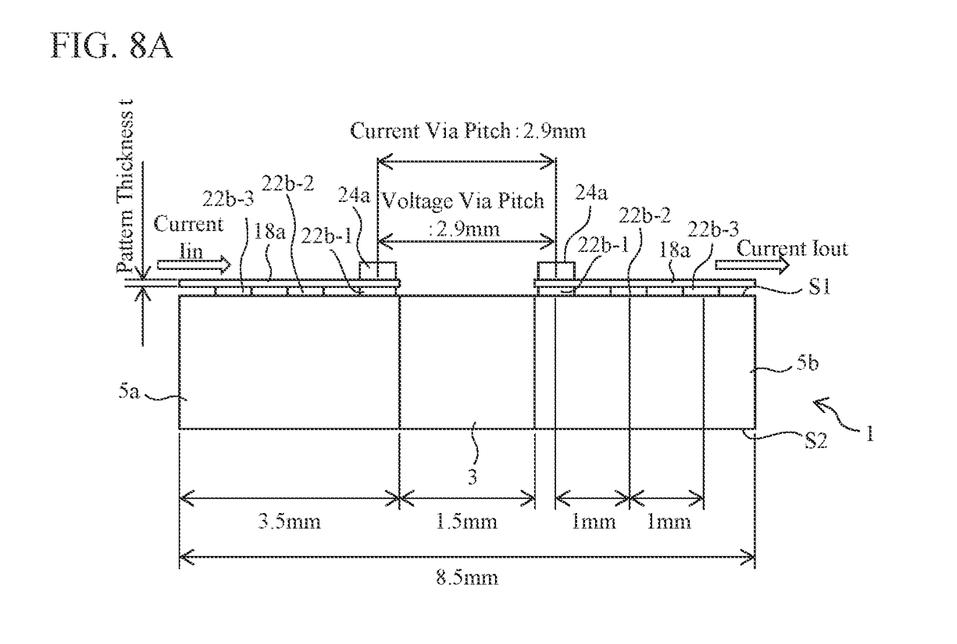
FIGS. 8A and 8B correspond to FIGS. 4A and 4B and show a side view illustrating one configuration example of the current sensing device according to a second embodiment of the present invention.
Figure 8B:
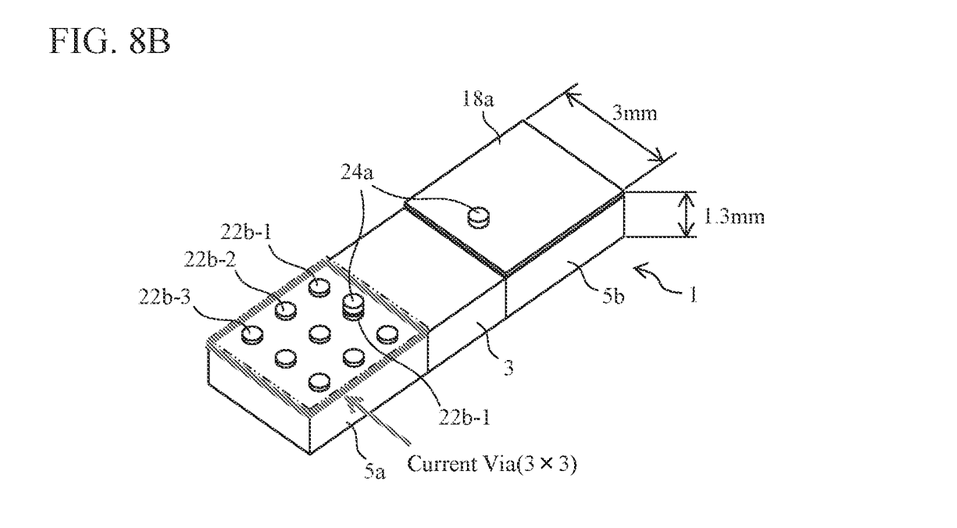

FIGS. 8A and 8B show a side view and a perspective view of a structure example which is different from FIGS. 4A and 4B in positional relationships between the shunt resistor, vias, and wires, illustrating one configuration example of the current, sensing device according to a second embodiment of the present invention. Specifically, in the example, the current wires 18a, current vias 22b-1 to 22b-3, and voltage vias 24a, 24a are formed on the first surface S1 side. As illustrated in FIG. 8A, a current Iin flows through the current wires 18a, the current vias 22b-1 to 22b-3, the electrode 5a, the resistive body 3, the current 5b, the heat-dissipating vias 22b (vias connected to the current 5b), the current wires 18, and out as a current Iout. The voltage vias 24a used for voltage sensing and a plurality of current vias 22b-1 to 22b-3 provided along therewith are connected by the wires 18a. As illustrated in FIG. 8B, the voltage vias 24a are each formed directly above the central one of three current vias 22b-1, with the wires 18a therebetween. FIG. 8B is a perspective view, illustrating in phantom view the current wire 18a connected to the electrode 5a. The arrangement enables a decrease in the influence of the TCR of the wires 18a.

Figure 9:
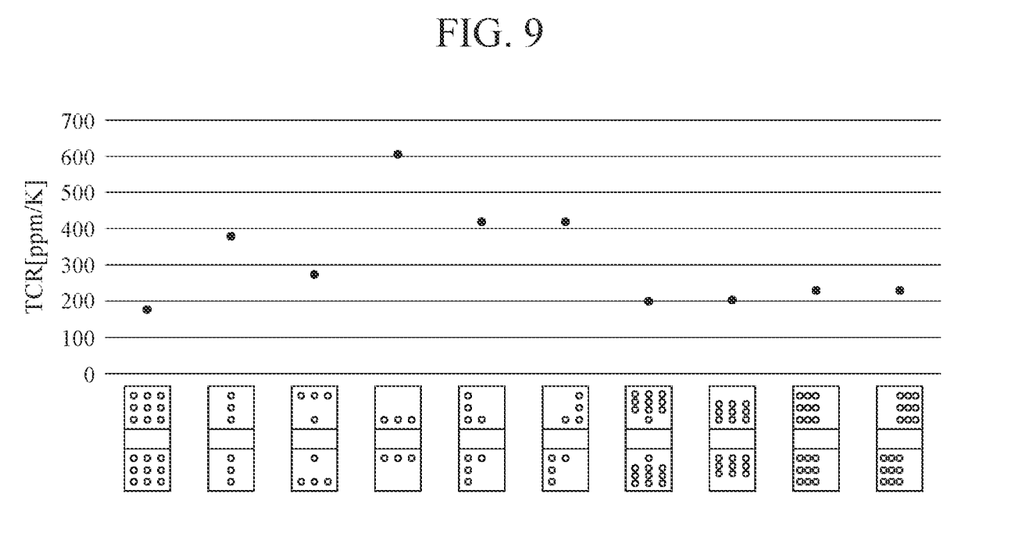
FIG. 9 illustrates TCR values in the structure illustrated in FIG. 6 and in other via-arrangement variations.

FIG. 9 illustrates TCR values observed when the via arrangement was modified in the structure of FIGS. 8A and 8B (the example in which the current wires 18a, the current vias 22b, and the voltage vias 24a are all formed on the S1 side). At the bottom of FIG. 9, the via arrangements of the shunt resistor are illustrated in plan view, with the TCR computation results shown directly above. As illustrated in FIG. 9, it is seen that, compared to the example of FIG. 5 in which the voltage vias and the current vias are separated between the first surface and the second surface, the dependency with respect to TCR on via arrangement and the number of vias (via density) is large. Specifically, when the current vias are arranged approximately uniformly with respect to one-half or more of the area of the electrodes 5a, 5b, as in the left-most example and the third and fourth examples from the right, the TCR is approximately 200 ppm/K. When the current vias are formed in a part of the plane of the electrodes 5a, 5b unevenly, as in the second to sixth examples from the left, the TCR tends to be higher.

Figure 10A:
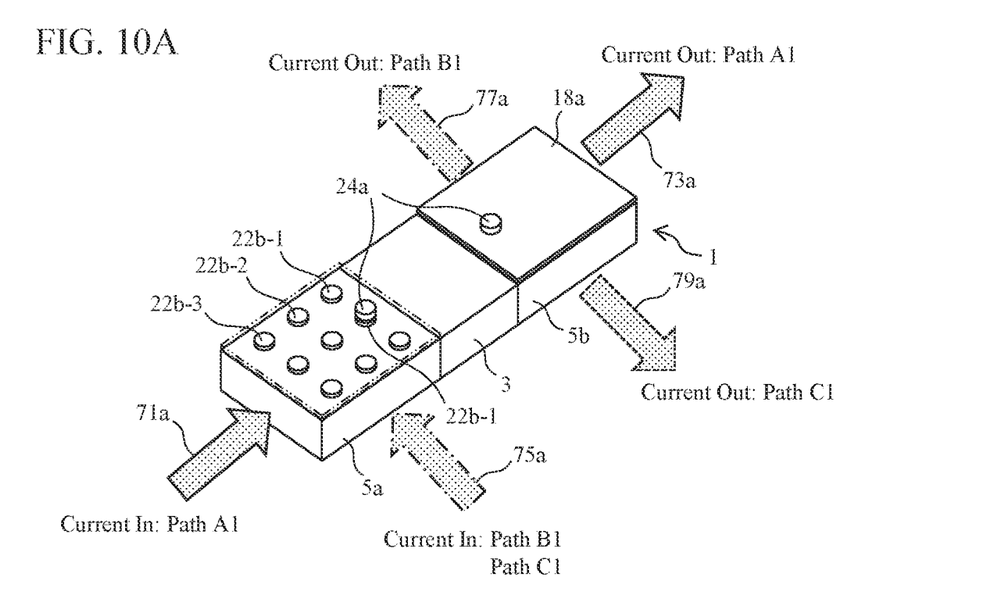
FIGS. 10A and 10B illustrate the relationship between the current path and via position of the current sensing device illustrated in FIGS. 8A and 8B, and depict a plurality of current paths.
Figure 10B:
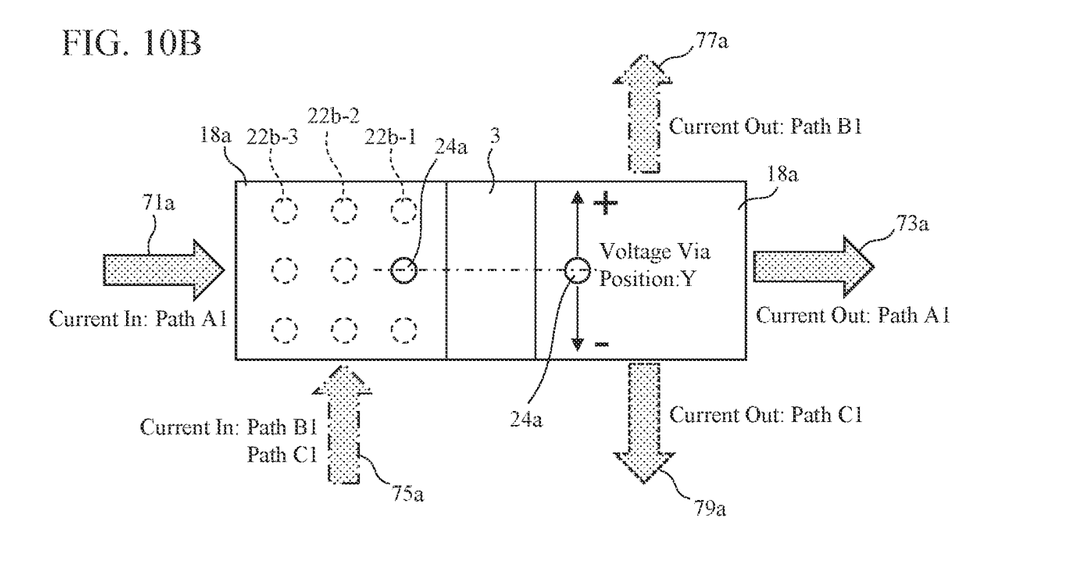
Figure 11:
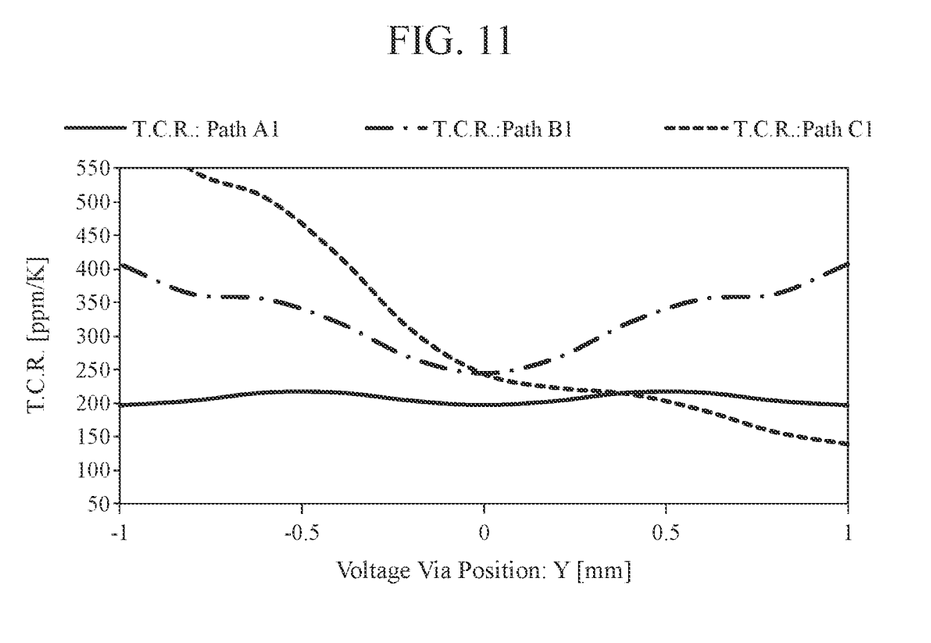
FIG. 11 illustrates the voltage via dependency of TCR in first to third current paths.

FIGS. 10A and 10B show a perspective view and a plan view illustrating a plurality of relationships between the current path and voltage vias of the current sensing device of FIGS. 8A and 8B. FIG. 11 illustrates the dependency of TCR on voltage via position (see FIG. 10B) in the different current paths.

FIGS. 10A and 10B illustrate a first current path A1 (71a-73a) in which current is flown linearly between the ends of the terminals of the current sensing device; a second current path B1 (75a-77a) in which current is flown in S-shape between side surfaces (different side surfaces) of the terminals of the current sensing device; and a third current path C1 (75a-79a) in which current is flown in U-shape between side surfaces (same side surfaces) of the terminals of the current sensing device.

FIG. 11 illustrates the dependency of TCR on voltage via position in the first to third current paths A1 to C1.

As illustrated in FIG. 11, it is seen that by changing the voltage via position with respect to the current path, the influence of TCR can be adjusted. It is seen that in the first current path A1, the value of TCR is small and the voltage via-position dependency is small. With regard to the second current path B1 it is preferable to arrange the voltage vias at Y=0, i.e., at approximately the center portion of the shunt resistor 1. With respect to the third current path C1, the TCR becomes lower as the position moves away from the side surface from which the current flows in and out, and approaches the side surface on the opposite side. Specifically, the position may preferably be spaced from the center position (Y=0) by 0.5 mm or more.

Third Embodiment

Figure 12A:
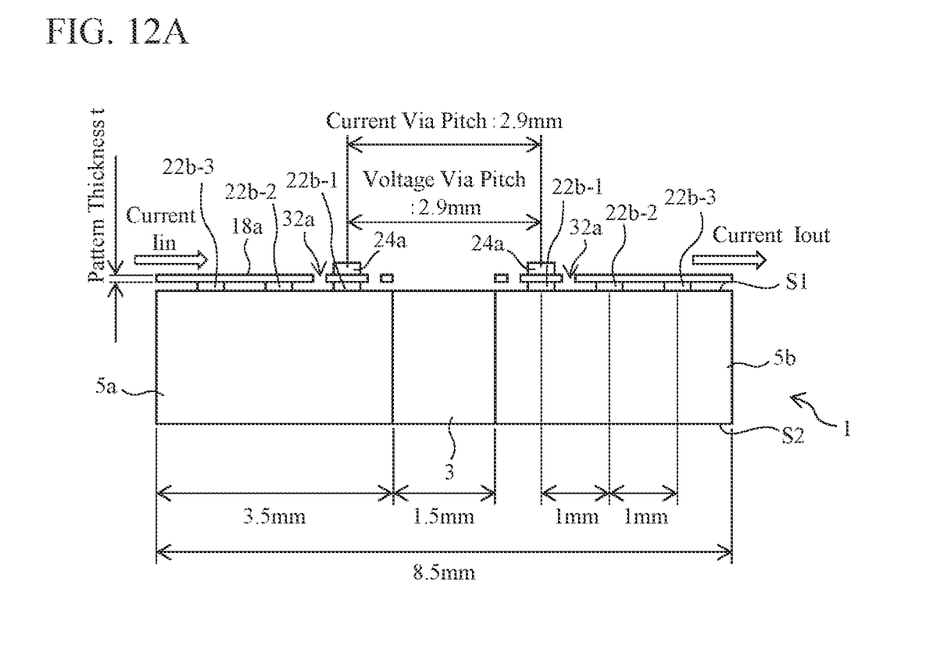
FIGS. 12A and 12B correspond to FIGS. 8A and 8B and show a side view illustrating one configuration example of the current sensing device according to a third embodiment of the present invention.
Figure 12B:
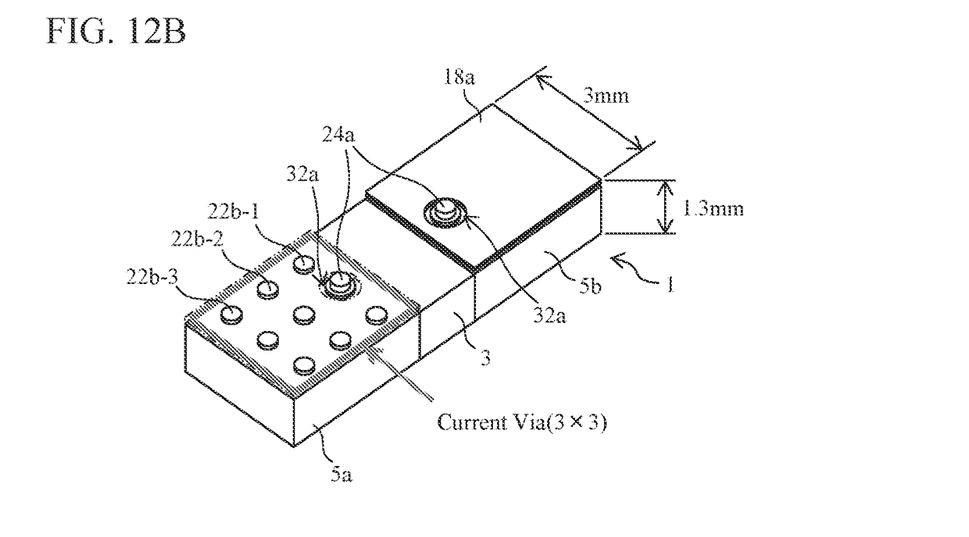

FIGS. 12A and 12B illustrate one configuration example of the current sensing device according to a third embodiment of the present invention. In this example, both the voltage vias 24a, 24a, the vias 22b-1, and the current vias 22b-2 to 3 are formed on the first surface S1. It is noted, however, that, as illustrated in FIGS. 12A and 12B, the voltage vias 24a, 24a and the vias 22b-1 and the current vias 22b-2 to 3 are not connected by the wires 18a, and instead the voltage vias and the current vias are severed from each other by a clearance 32a. In the present configuration example, the vias 22b-1 function as vias used for voltage sensing.

In this way, it is possible to lower the TCR compared to when the clearance wires 18a are connected. Specifically, the TCR can be made less than or equal to 200 ppm/K, such as on the order of 165 ppm/K.

As described above, even when the voltage vias and the current vias are provided on the first surface of the insulating resin substrate, it is possible to reduce the influence of TCR by cutting a wire between the voltage vias and the current vias.

In the foregoing embodiments, the configurations and the like that have been illustrated are not limiting and may be modified, as appropriate, within a range such that the effects of the present invention can be obtained. The configurations and the like may also be modified otherwise as appropriate and implemented without departing from the objectives of the present invention.

The constituent elements of the present invention may be selected as needed, and an invention having a selected configuration is also included in the present invention.

INDUSTRIAL APPLICABILITY

The present invention may be utilized for a current sensing device.

The invention claimed is:

1. A current sensing device comprising:
an insulating resin substrate made of a first insulating material, wherein the insulating resin substrate is formed with a hole inside of the insulating resin substrate;
a current sensing element arranged in the hole formed in the resin substrate;
a resin layer made of a second insulating material different from the first insulating material, wherein the resin layer covers the insulating resin substrate in its entirety and secure the current sensing element to the insulating resin substrate;
a current wire provided through the resin layer in contact with the current sensing element to supply an electrical current to the current sensing element;
a plurality of current vias provided through the resin layer to connect the current sensing element and the current wire; and
a voltage sensing via connected to the current sensing element to measure a voltage drop that takes place through the current sensing element.

2. The current sensing device according to claim 1, wherein:
the current vias are provided on a first surface side of the resin substrate; and
the voltage sensing via is provided on a second surface side of the resin substrate opposite to the first surface side.

3. The current sensing device according to claim 1, wherein:
the current vias and the voltage sensing via are both provided on one of a first surface side and a second surface side, opposite to the first surface side, of the resin substrate; and
the current vias and the voltage sensing via electrically separated from each other.

4. The current sensing device according to claim 1, wherein:
the current sensing element comprises a shunt resistor; and
the shunt resistor includes a resistive body having a thickness of more than or equal to 0.5 mm.

5. The current sensing device according to claim 2, wherein the first surface and the second surface of the resin substrate are coextensive, respectively, with a first surface and a second surface of the current sensing element.

6. The current sensing device according to claim 1, wherein the resin substrate and the current sensing element are covered with the resin layer.

7. The current sensing device according to claim 6, wherein the resin layer covers the resin substrate and the current sensing element, and the current vias are formed so as to penetrate the resin layer.

\* \* \* \* \*